United States Patent
Maillard et al.

(10) Patent No.: US 9,793,899 B1
(45) Date of Patent: Oct. 17, 2017

(54) MITIGATION OF SINGLE EVENT LATCHUP

(71) Applicant: Xilinx, Inc., San Jose, CA (US)

(72) Inventors: Pierre Maillard, Campbell, CA (US);
Jue Arver, San Jose, CA (US);
Michael J. Hart, Palo Alto, CA (US);
John K. Jennings, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/382,385

(22) Filed: Dec. 16, 2016

(51) Int. Cl.
*H03K 19/003* (2006.01)
*H03K 19/177* (2006.01)

(52) U.S. Cl.
CPC ............................. *H03K 19/17764* (2013.01)

(58) Field of Classification Search
CPC ................................................ H03K 19/17764
USPC ..................................... 326/9, 14, 15, 16, 37
See application file for complete search history.

(56) References Cited

U.S. PATENT DOCUMENTS

| | | | |
|---|---|---|---|
| 5,610,790 A | 3/1997 | Staab et al. |
| 5,828,231 A | 10/1998 | Bazargan |
| 5,880,620 A | 3/1999 | Gitlin et al. |
| 5,933,025 A | 8/1999 | Nance et al. |
| 6,028,450 A | 2/2000 | Nance |
| 6,198,304 B1 | 3/2001 | Sasaki |
| 6,232,818 B1 | 5/2001 | Zaliznyak |
| 6,353,333 B1 | 3/2002 | Curd et al. |
| 6,753,239 B1 | 6/2004 | Conn |
| 6,864,156 B1 | 3/2005 | Conn |
| 7,064,391 B1 | 6/2006 | Conn |
| 7,138,820 B2 | 11/2006 | Goetting et al. |
| 7,230,445 B1 | 6/2007 | Goetting et al. |
| 7,233,532 B2* | 6/2007 | Vadi ................ H03K 19/17744 326/37 |
| 7,235,999 B2 | 6/2007 | Goetting et al. |
| 7,279,987 B1 | 10/2007 | Kaszynski |
| 7,456,654 B1 | 11/2008 | Rau et al. |
| 7,599,299 B2 | 10/2009 | Goetting et al. |
| 7,710,813 B1 | 5/2010 | Im et al. |
| 7,809,864 B1 | 10/2010 | Young et al. |
| 7,812,642 B1 | 10/2010 | Jennings et al. |
| 7,919,845 B2 | 4/2011 | Karp et al. |
| 7,948,269 B1 | 5/2011 | Ballantyne et al. |
| 8,134,813 B2 | 3/2012 | Karp et al. |
| 8,293,547 B2 | 10/2012 | Karp et al. |
| 8,332,550 B1 | 12/2012 | Young et al. |
| 8,881,085 B1 | 11/2014 | Karp et al. |
| 9,013,845 B1 | 4/2015 | Karp |

(Continued)

OTHER PUBLICATIONS

Xilinx, Inc., "UltraScale Architecture System Monitor", User Guide, UG580 (v1.6) May 26, 2016, 108 pages, San Jose, CA USA.

*Primary Examiner* — Daniel D Chang
(74) *Attorney, Agent, or Firm* — LeRoy D. Maunu

(57) ABSTRACT

The disclosed IC includes a load circuit and a temperature sensor circuit. The temperature sensor circuit measures temperature of the IC and stores temperature data in a register. An SEL mitigation circuit monitors the IC for a temperature change indicative of an SEL. A temperature change greater than a threshold over a time interval is indicative of an SEL. The SEL mitigation circuit is configured to reduce voltage applied to the IC to a voltage level that clears an SEL in the IC in response to a temperature change exceeding the threshold and to increase voltage applied to the load circuit after the reduction in voltage.

20 Claims, 4 Drawing Sheets

(56) References Cited

U.S. PATENT DOCUMENTS

| | | |
|---|---|---|
| 9,058,853 B2 | 6/2015 | Hart et al. |
| 2013/0335875 A1* | 12/2013 | Baumann ............... G11O 5/005 361/111 |
| 2017/0033554 A1* | 2/2017 | Vail ........................ H02H 3/087 |

* cited by examiner

MITIGATION OF SINGLE EVENT LATCHUP

TECHNICAL FIELD

The disclosure generally relates to single event effects, and more particularly to single event latchup.

BACKGROUND

Mitigating single event effects (SEEs) is becoming increasingly important as advances in integrated circuit (IC) technology reduce feature sizes and power requirements. Mitigating SEEs is especially important for mission-critical applications, because an SEE could jeopardize an entire mission. For example, ICs deployed in spacecraft applications are more susceptible to the high-energy particles that cause SEEs. An SEE in a mission-critical IC of the spacecraft could cause a total failure of the spacecraft, which took a sizable investment to design, build, and launch.

SEEs may range from soft errors that are transient or correctable, to hard errors that are not correctable or that may permanently damage an IC. An SEE is generally classified as a single event upset (SEU), a single event burnout (SEB), or a single event latchup (SEL). An SEU is a transient, soft error, and is non-destructive and is caused by a charged particle passing through an IC leaving a wake of electron-hole pairs.

An SEB can cause permanent failure of an IC due to a high current state in a transistor. For example, a power MOSFET biased in the OFF state (i.e., blocking a high drain-source voltage) can suffer an SEB when a heavy ion passing through the MOSFET deposits sufficient charge to turn the device on.

An SEL is a hard error that can potentially destroy an IC. Latchups can be caused by heavy ions or by protons in a sensitive device. An SEL occurs when the vertical and lateral parasitic bipolar junction transistors (BJTs) of a device are activated by an ion strike. Activation of both the vertical and lateral BJTs results in an abnormally high operating current in the device. The ion-induced high current can permanently disable a device if the SEL is not quickly detected and cleared. Cycling power off and on can restore the device to normal operation if the device has not already been permanently damaged. However, in some applications cycling power to the device may result in significant device down time and therefore be unacceptable.

SUMMARY

An implementation of an integrated circuit (IC) includes a load circuit and a temperature sensor circuit. The temperature sensor circuit is configured and arranged to measure temperature of the semiconductor die and store data indicative of the temperature in a register. A single event latchup (SEL) mitigation circuit is coupled to the register and is configured and arranged to monitor the IC for a temperature change indicative of an SEL. A temperature change greater than a threshold over a time interval is indicative of an SEL. For the monitoring, the SEL mitigation circuit is configured to read from the register data indicative of a first temperature of the IC at a beginning of the time interval, and read from the register data indicative of a second temperature of the IC at an end of the time interval. The SEL mitigation circuit determines a difference between the second temperature and the first temperature, and reduces voltage applied to the load circuit to a voltage level that clears an SEL in the load circuit in response to the difference being greater than the threshold. The SEL monitoring circuit increases voltage applied to the load circuit after having reduced the voltage.

A disclosed method of mitigating effects of an SEL in an IC includes monitoring the IC for a temperature change indicative of an SEL. The monitoring includes determining a first temperature of the IC at a beginning of the time interval, determining a second temperature of the IC at an end of the time interval, and determining a difference between the second temperature and the first temperature. If the difference is greater than the threshold, the method reduces voltage applied to a load circuit implemented on the IC, to a voltage level that clears an SEL in the load circuit. After reducing the voltage, the voltage applied to the load circuit is increased to a normal operating level.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings in which.

DETAILED DESCRIPTION

Figure 1:
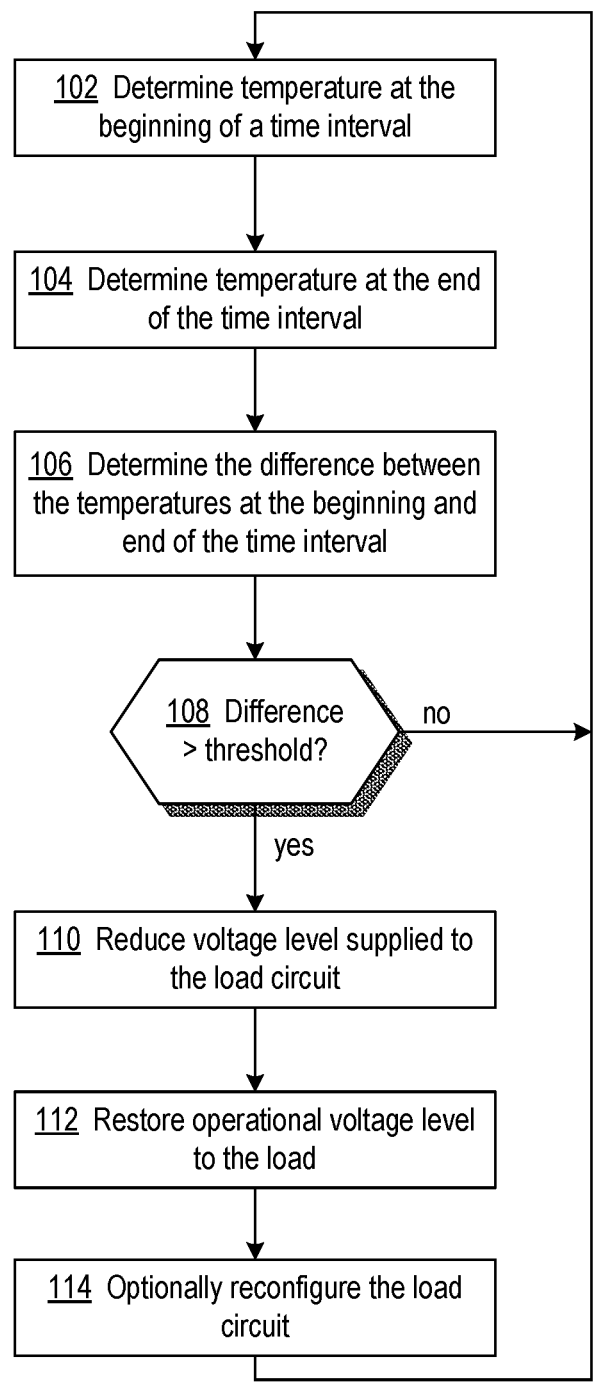
FIG. 1 is a flowchart of a process for mitigating SELs.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

The inventors have found that the high-current level caused by an SEL results in an abrupt change in temperature in an IC die. Promptly recognizing the abrupt temperature change and taking corrective action can be effective in mitigating an SEL. The inventors recognized that such an abrupt temperature change can be quantified as a temperature change that exceeds a threshold and that occurs over a certain period of time. The disclosed SEL mitigation circuitry monitors for abrupt changes in temperature to determine whether or not an SEL has occurred. The disclosed approaches avoid the use of current monitors, which can occupy significant chip or package space.

The disclosed approaches provide fast detection and mitigation of an SEL, thereby reducing the probability of a permanent failure to near zero. In one implementation, a built-in temperature sensor is used to detect any abrupt temperature variation, which can be indicative of an SEL. For example, a temperature increase of at least 10° C. die within 5 seconds is identified as an SEL by an SEL mitigation circuit on a particular IC die. Different temperature changes over different intervals of time may be applicable to different IC dies having different application circuitry. In response to detecting an abrupt change in temperature, the SEL mitigation circuit reduces the supply voltage to clear the SEL. For example, in one implementation, the supply voltage can be reduced to (supply_voltage/2)−0.1V. In an application in which a field programmable gate array (FPGA) is embedded in a system on chip (SOC), the supply voltage to the FPGA can be reduced instead of cycling power to the entire SOC to reduce the time expended in mitigation of the SEL. In some applications, cycling power may be acceptable.

After the voltage level has been reduced to a sufficient level and for a sufficient period of time for the SEL to be cleared, the voltage level can be restored to the level used for normal operations. In an application in which the circuit is an FPGA, the FPGA can then be reconfigured with configuration data to restore functionality of the FPGA.

FIG. 1 is a flowchart of a process for mitigating SELs. The mitigation of SELs can be accomplished by an SEL mitigation circuit that occupies the IC die having the circuitry that is monitored for an SEL. The SEL mitigation circuit determines the temperature of the IC die at the beginning of a time interval at block 102. In an exemplary implementation, the IC die has a built-in temperature sensor that continually measures the temperature of the IC die, generates a data value indicative of the temperature, and stores the temperature data value in a register that is accessible to the SEL mitigation circuit. At block 104, the SEL mitigation circuit determines the temperature of the IC die at the end of the time interval.

The SEL mitigation circuit can be configured to read the temperature data value from the register at application-specific times. In one implementation, the SEL mitigation circuit is configured to read the temperature data value periodically, for example, every 5 seconds. In another implementation, the SEL mitigation circuit can be configured to bypass reading the temperature data value at times when the IC die is known to experience a large processing load. For example, the I/O activity or compute activity of the IC die may be monitored and the temperature monitoring can be suspended during periods of high activity. Alternatively, during such periods of increased processing load, a different threshold number of degrees and/or time period may be used to detect an abrupt change in temperature.

At block 106, the SEL mitigation circuit determines the difference between the temperature data value at the beginning of the time interval and the temperature data value at the end of the time interval. If the difference is not greater than a threshold number of degrees, which can be configured in the SEL mitigation circuit, decision block 108 returns the process to block 102.

If the difference between the temperatures determined at the beginning and at the end of the time interval is greater than the threshold, at block 110 the SEL mitigation circuit signals a voltage regulator to reduce the voltage level supplied to a load circuit on the IC die. As described above, on an SOC some of the circuitry may be more susceptible to an SEL than other circuitry. For example, FPGA circuitry may be more susceptible to an SEL than instruction processor circuitry. The load circuit to which the supply voltage is reduced is the FPGA circuitry in an exemplary application. As indicated above, in an exemplary application the supply voltage can be reduced to (supply_voltage/2)−0.1V. The voltage level to other circuitry on the IC die can be maintained at a level that permits the other circuitry to continue functioning. The reduced supply voltage to the load circuit clears the SEL. In some applications or implementations, the SEL mitigation circuit may signal the voltage regulator to turn off power to the load circuit such as by maintaining 0 volts at a supply pin. The reduced voltage level can be maintained for less than one second to clear the SEL. Those skilled in the art that a load circuit affected by an SEL may be part of different types of integrated circuits, including but not limited to, application specific integrated circuit (ASICs), application specific standard products (ASSPs), programmable logic devices (PLDs), etc.

At block 112, the SEL mitigation circuit signals the voltage regulator to restore the supply voltage to the load circuit to an operational level. The load circuit can be optionally reconfigured at block 114. The SEL mitigation circuit can provide a signal to processor circuitry on the SOC to initiate the reconfiguration in some applications.

In applications in which multiple chips are assembled into a single package, such as in multi-chip modules or stacked silicon interconnect, partial reconfiguration may be feasible and preferable over full reconfiguration. For example, in a package having multiple FPGA semiconductor dies, an SEL might be detected on a particular one of the dies. In this scenario, the SEL mitigation circuit maintains the voltage level on the die on which not SEL was detected and partially reconfigures the package by reconfiguring only the semiconductor die on which the SEL was detected.

After the operating voltage level to the load circuit has been restored and any required reconfiguration has been performed, the process returns to block 102 to continue monitoring the circuit for the occurrence of an SEL by repeating the designated process steps.

In some implementations, the SEL mitigation circuit can be selectively disabled in order to avoid a possible false-positive detection of an SEL. An increase in temperature of the IC die may be caused by factors other than an SEL. For example, a substantial increase in a processing load, such as a high volume of input data or computationally intensive processing, can result in a dramatic increase in temperature.

In order to avoid mistakenly detecting an SEL and taking corrective measures, a load monitor circuit monitors the processing load of the load circuit. The monitoring of load monitor circuit can be application dependent. For example, the load monitor circuit can monitor the quantity of input data to the load circuit. Alternatively, the load monitor circuit can be configured to detect when the load circuit is performing computationally intensive processing. Compute-intensive processing is processing that requires sustained signal or program execution over a prolonged period, such as digital signal processing or graphics processing.

Figure 2:
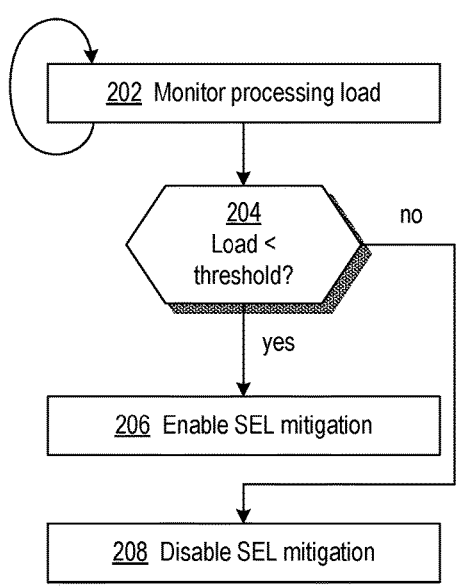
FIG. 2 shows a flowchart of a process of monitoring the processing load on the IC die.
Figure 3:
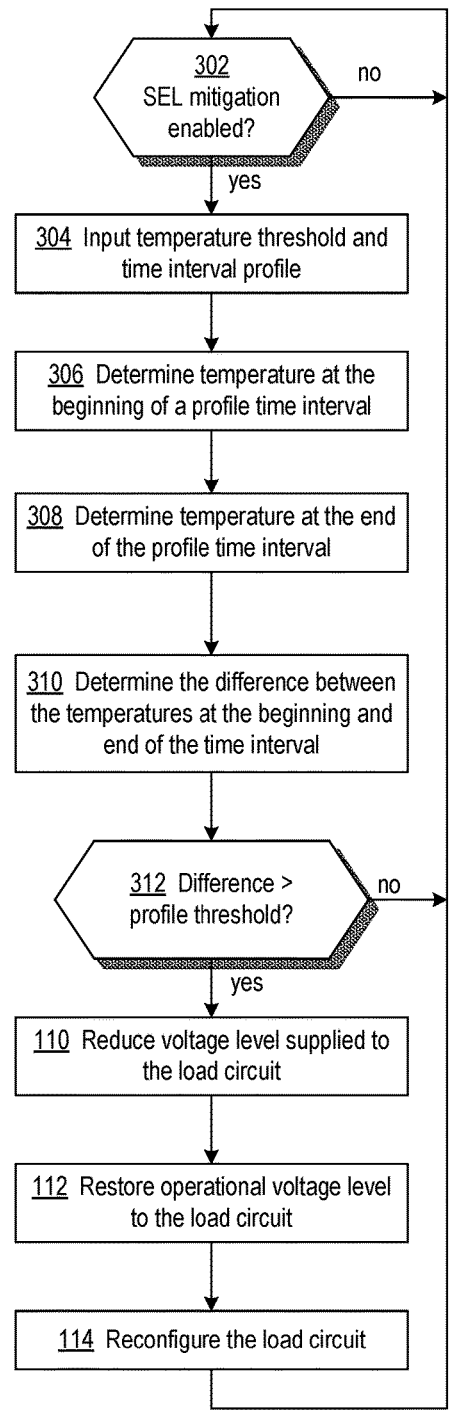
FIG. 3 shows a flowchart of a process in which the mitigation of SELs is enabled/disabled or modified based on the processing load.

FIG. 2 shows a flowchart of a process of monitoring the processing load on the IC die, and FIG. 3 shows a flowchart of a process in which the mitigation of SELs is enabled/disabled or modified based on the processing load. At block 202, a load monitor circuit on the IC die monitors the processing load of the circuitry. The load monitor circuit can be configured to monitor the quantity of input data to be processed on the IC die and/or whether or not the circuitry on the IC die is involved in compute-intensive operations. If the processing load is less than a threshold, SEL mitigation is enabled at block 206, such as by the load monitor circuit indicating by a load signal to the SEL mitigation circuit to enable SEL mitigation. Otherwise, at block 208 SEL mitigation is disabled such as by signaling the SEL mitigation circuit to disable SEL mitigation.

FIG. 3 shows the process of the SEL mitigation circuit performing or bypassing SEL mitigation in response to a signal from the load monitor. The process of FIG. 3 optionally uses a profile(s) to control the duration of an interval of time over which a change in temperature is determined and/or control the threshold number of degrees.

At decision block 302, the SEL mitigation circuit determines whether SEL mitigation is enabled or disabled, for example, based on a signal state from a load monitor. If SEL mitigation is disabled, the processing of blocks 304-312 and 110-114 is bypassed until SEL mitigation is enabled. The enabling and disabling of SEL mitigation can result in periods of monitoring for a temperature change in multiple intervals interspersed with periods of bypassing the monitoring for a temperature change.

If SEL mitigation is enabled, at block 304 the SEL mitigation circuit optionally inputs a temperature and time interval profile. For some applications, the variations in the processing load may be known to occur at certain times, or different processing loads may exhibit different temperature profiles over time. For different processing load scenarios, the SEL mitigation circuit can load different time-temperature profiles to suitably adjust the durations of the intervals over which the temperature change is measured and/or adjust the threshold number of degrees that indicates an SEL. The duration of the time intervals and/or the threshold number of degrees can be varied according to the processing load.

The SEL mitigation circuit determines the temperature of the IC die at the beginning of the profile-specified time interval at block 306 and determines the temperature of the IC die at the end of the profile-specified time interval at block 308. At block 310, the SEL mitigation circuit determines the difference between the temperature data values determined at the beginning and at the end of the time profile-specified interval. If the difference is not greater than a profile-specified threshold number of degrees, which can be configured in the SEL mitigation circuit, decision block 312 returns the process to decision block 302. Otherwise, SEL mitigation operations are performed at blocks 110, 112, and 114, as described above for FIG. 1.

Figure 4:
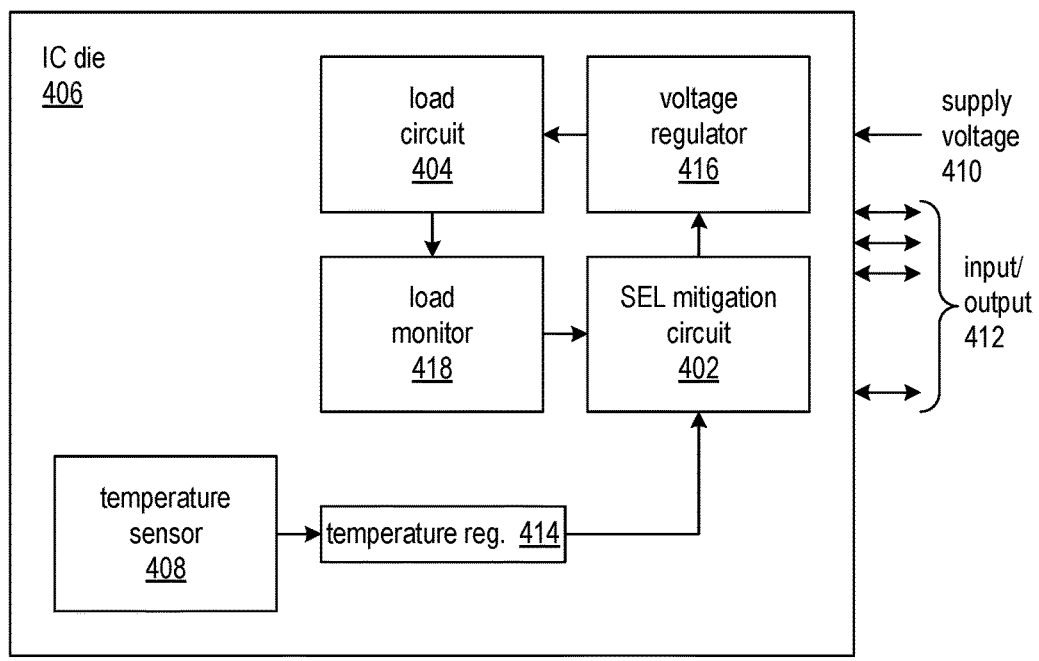
FIG. 4 shows an integrated circuit having an SEL mitigation circuit for protecting against SELs in a load circuit.

FIG. 4 shows an integrated circuit having an SEL mitigation circuit 402 for protecting against SELs in a load circuit 404. The load circuit 404 can be any circuit that is susceptible to SELs, such as FPGA circuitry or other SRAM-based circuits, for example.

In an exemplary implementation, the SEL mitigation circuit 402 and load circuit 404 are implemented on an IC die 406, which also includes a temperature sensor circuit 408. The IC die includes a pin for input of a supply voltage 410 as well as pins for input/output signals 412. The temperature sensor circuit includes a sensor that measures the temperature of the IC die 406, and an analog-to-digital (ADC) converter that converts an analog signal into a data value that indicates the current temperature and stores the data value in the temperature register 414.

Some SOCs, such as those available from XILINX®, Inc., include built-in temperature sensor circuits. For example, the SYSMON circuitry in XILNIX SOCs includes an analog-to-digital converter (ADC) as well as on-chip sensors that can be used to sample external voltages and monitor on-die operating conditions, such as temperature and supply voltage levels. The ADC supports differential sampling of unipolar and bipolar analog input signals and provides a wide range of operating modes to convert multiple external analog input channels. Status registers store the ADC's sampled data, which can be accessed through a dynamic reconfiguration port (not shown), through an external JTAG interface (not shown), through an I2C interface (not shown), through a power management bus (not shown), or through an advanced peripheral bus (not shown), depending on the particular capabilities of the SOC.

The SEL mitigation circuit 402 is configured to read the data value from the temperature register 414 at different times to monitor for an abrupt temperature change in the IC die 406. The SEL mitigation circuit is configured to read the data value from the temperature register at the beginning of a time interval and at the end of a time interval and determine the difference between the current temperatures indicated by the data values. In response to the difference being greater than a threshold number of degrees, the SEL mitigation circuit signals the voltage regulator 416 to reduce the voltage supplied to the load circuit 404. The voltage level is reduced and held at the reduced level for a sufficient period of time to clear the SEL. The level of the reduced voltage can be 0 V to effectively remove power to the load circuit or the reduced voltage can be some minimal level as discussed above. The length of the time interval over which a change in temperature is determined and the threshold number of degrees can be determined through testing particular IC dice and suitable values programmed as configuration data values in the SEL mitigation circuit.

After the load circuit 404 has been held at the reduced voltage level for a period of time sufficient to clear the SEL, the SEL mitigation circuit signals the voltage regulator to restore voltage supplied to the load circuit to an operational level. In an implementation in which the load circuit is an FPGA, the SEL mitigation circuit can be further configured to reconfigure or initiate reconfiguration of the programmable circuitry. The SEL mitigation circuit can be further configured to continually monitor for SELs by repeatedly reading the temperature data values over multiple time intervals and checking for a temperature change that exceeds the threshold.

In another implementation, the IC die further includes a load monitor circuit 418. The load monitor circuit is configured to monitor the processing load of the load circuit and signal the SEL mitigation circuit 402 to enable or disable monitoring for SELs. As indicated above, the processing load can be indicated by the quantity of input data to the load circuit or the load circuit performing computationally intensive processing. The load monitor circuit can indicate by the state of a load signal whether the processing load is above or below a load threshold. In response to the signal(s) from the load monitor circuit, the SEL mitigation circuit can switch between periods of monitoring for SELs and not monitoring for SELs. In addition, during monitoring periods the SEL mitigation circuit can use different time and temperature profiles. Each profile can specify the duration and time interval and an associated threshold number of degrees. The SEL mitigation circuit can use different time and temperature profiles in different monitoring periods to account for different processing loads, which may cause different increases in temperature of the IC die over different intervals.

Figure 5:
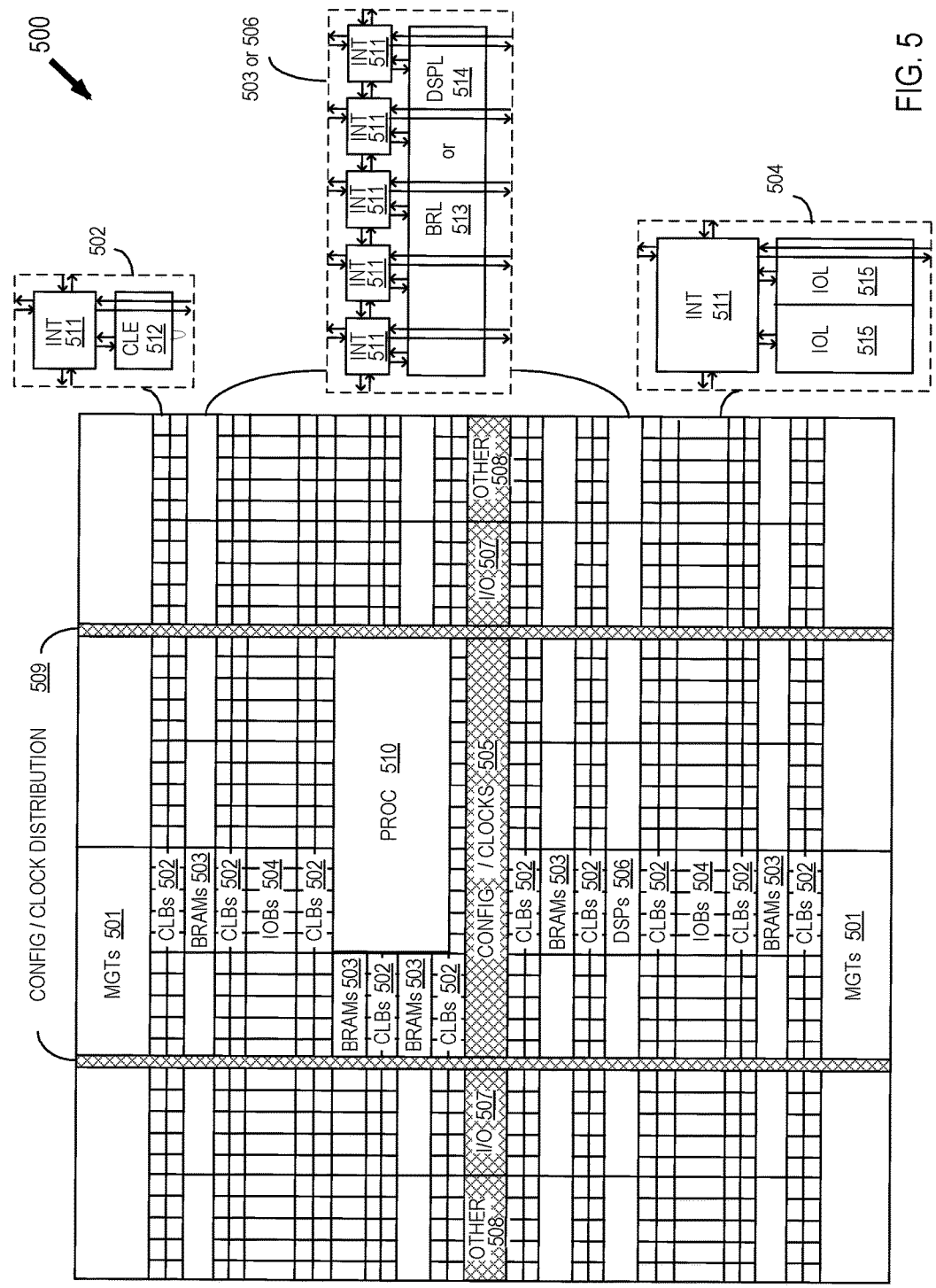
FIG. 5 shows a programmable integrated circuit (IC) on which the disclosed circuits and processes may be implemented.

FIG. 5 shows a programmable integrated circuit (IC) 500 on which the disclosed circuits and processes may be implemented. The programmable IC may also be referred to as a System On Chip (SOC) that includes field programmable gate array logic (FPGA) along with other programmable resources. FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An 10B 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for mitigation of SELs. Other aspects and features will be apparent to those skilled in the art from consideration of the specification. The methods and system may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. An integrated circuit (IC), comprising:
a load circuit;
a temperature sensor circuit configured and arranged to measure temperature of the IC and store data indicative of the temperature in a register; and
a single event latchup (SEL) mitigation circuit coupled to the register and configured and arranged to monitor the IC for a temperature change indicative of an SEL, wherein a temperature change greater than a threshold over a time interval is indicative of an SEL, and in monitoring, the SEL mitigation circuit is configured to:
read from the register data indicative of a first temperature of the IC at a beginning of the time interval,
read from the register data indicative of a second temperature of the IC at an end of the time interval,
determine a difference between the second temperature and the first temperature,
reduce voltage applied to the load circuit to a voltage level that clears an SEL in the load circuit in response to the difference being greater than the threshold, and
increase voltage applied to the load circuit after the reduction in voltage.

2. The IC of claim 1, wherein:
the load circuit includes programmable logic; and
the SEL mitigation circuit is further configured and arranged to reconfigure the programmable logic after increasing the voltage.

3. The IC of claim 1, wherein the SEL mitigation circuit is further configured and arranged to:
remove power from the load circuit in reducing the voltage; and
apply power to the load circuit after removing power from the load circuit.

4. The IC of claim 1, further comprising:
a first semiconductor die having the temperature sensor circuit disposed thereon;
a second semiconductor die including programmable logic;
wherein the load circuit includes programmable logic on the first semiconductor die; and
wherein the SEL mitigation circuit is further configured and arranged to:
maintain a voltage level applied to the programmable logic on the second semiconductor die when voltage to the load circuit on the first semiconductor die is reduced, and
partially reconfigure the IC by reconfiguring the programmable logic of the load circuit on the first semiconductor die after increasing the voltage and not reconfiguring the programmable logic on the second semiconductor die.

5. The IC of claim 1, wherein the SEL mitigation circuit is further configured and arranged to:
repeat the reading of data indicative of the first temperature and the reading of data indicative of the second temperature for a plurality of time intervals; and
vary durations of the plurality of the intervals.

6. The IC of claim 1, wherein the SEL mitigation circuit is further configured and arranged to:
repeat the reading of data indicative of the first temperature and reading of data indicative of the second temperature for a plurality of time intervals; and
vary the threshold in the plurality of the intervals.

7. The IC of claim 1, wherein the SEL mitigation circuit is further configured and arranged to:
repeat the reading of data indicative of the first temperature and the reading of data indicative of the second temperature for a plurality of time intervals; and
vary durations of the plurality of the intervals and the threshold in the plurality of the intervals.

8. The IC of claim 1, wherein the SEL mitigation circuit is further configured and arranged to:
repeat the reading of data indicative of the first temperature, the reading of data indicative of the second temperature, and determining the difference for a plurality of time intervals; and
bypass during a non-monitoring period that is between two of the plurality of time intervals, the reading of data indicative of the first temperature, the reading of data indicative of the second temperature, the determining the difference, and the reducing of the voltage.

9. The IC of claim 1, wherein the SEL mitigation circuit is further configured and arranged to:
monitor a processing load of the integrated circuit and generating a load signal by a monitor circuit, wherein the load signal is indicative of a level of the processing load;
enable, in response to the load signal indicating the level of the processing load is below a load threshold, the reading of data indicative of the first temperature, the reading of data indicative of the second temperature, and determining the difference for one or more time intervals; and
disable, in response to the load signal indicating the level of the processing load is above the load threshold, the reading of data indicative of the first temperature, the reading of data indicative of the second temperature, the determining the difference, and the reducing of the voltage.

10. A method of mitigating effects of single-event latchup (SEL) in an integrated circuit (IC), comprising:
monitoring the IC for a temperature change indicative of an SEL, wherein a temperature change greater than a threshold over a time interval is indicative of an SEL, and the monitoring includes:
determining a first temperature of the IC at a beginning of the time interval,
determining a second temperature of the IC at an end of the time interval, and
determining a difference between the second temperature and the first temperature; and
in response to the difference being greater than the threshold:
reducing voltage applied to a load circuit implemented on the IC, to a voltage level that clears an SEL in the load circuit, and increasing voltage applied to the load circuit after the reducing of the voltage.

11. The method of claim 10, wherein the load circuit includes programmable logic and the method further comprising reconfiguring the programmable logic after increasing the voltage.

12. The method of claim 10, wherein:
the reducing of the voltage includes turning off power to the load circuit; and
the method further including applying power to the load circuit after turning off power to the load circuit.

13. The method of claim 10, wherein:
the IC is implemented on a semiconductor die;
the determining the first temperature includes measuring the first temperature by a temperature sensor circuit implemented on the semiconductor die;
the determining the second temperature includes measuring the second temperature by the temperature sensor circuit;
the determining the difference includes determining the difference by an SEL mitigation circuit on the semiconductor die; and
the reducing the voltage applied to the IC includes generating a signal from the SEL mitigation circuit to a voltage regulator.

14. The method of claim 13, wherein:
the determining the first temperature includes:
writing a first data value indicative of the first temperature to a register on the semiconductor die, and
reading the first data value from the register by the SEL mitigation circuit at the beginning of the time interval; and
the determining the second temperature includes:
writing a second data value indicative of the first temperature to the register, and
reading the second data value from the register by the SEL mitigation circuit at the end of the time interval.

15. The method of claim 10, wherein IC includes a first semiconductor die and a second semiconductor die, the load circuit includes programmable logic on the first semiconductor die, and the second semiconductor die includes programmable logic, the method further comprising:
maintaining a voltage level applied to the programmable logic on the second semiconductor die when voltage to the load circuit on the first semiconductor die is reduced; and
partially reconfigure the IC by reconfiguring the programmable logic of the load circuit on the first semiconductor die after increasing the voltage and not reconfiguring the programmable logic on the second semiconductor die.

16. The method of claim 10, further comprising:
repeating the determining the first temperature and determining the second temperature for a plurality of time intervals; and
varying durations of the plurality of the intervals.

17. The method of claim 10, further comprising:
repeating the determining the first temperature and determining the second temperature for a plurality of time intervals; and
varying the threshold in the plurality of the intervals.

18. The method of claim 10, further comprising:
repeating the determining the first temperature and determining the second temperature for a plurality of time intervals; and
varying durations of the plurality of the intervals and the threshold in the plurality of the intervals.

19. The method of claim 10, further comprising:
repeating the determining the first temperature, determining the second temperature, and determining the difference for a plurality of time intervals; and
bypassing during a non-monitoring period that is between two of the plurality of time intervals, the determining the first temperature, determining the second temperature, determining the difference, and reducing voltage.

20. The method of claim 10, further comprising:
monitoring a processing load of the integrated circuit and generating a load signal by a monitor circuit, wherein the load signal is indicative of a level of the processing load;
enabling, in response to the load signal indicating the level of the processing load is below a load threshold, the determining the first temperature, determining the second temperature, and determining the difference for one or more time intervals; and
disabling, in response to the load signal indicating the level of the processing load is above the load threshold, the determining the first temperature, determining the second temperature, determining the difference, and reducing voltage.

\* \* \* \* \*